United States Patent [19]

Ferrarin

[11] 4,017,802
[45] Apr. 12, 1977

[54] STORED ELECTRONIC DEVICE FOR PRODUCING PULSES HAVING PREDETERMINED RATE AND SEQUENCE

[75] Inventor: Francesco Ferrarin, Milan, Italy

[73] Assignee: Societa' Italiana Materiali Pressati Resinati e Simili - S.I.M.P.R.E.S. - S.r.l., Milan, Italy

[22] Filed: July 17, 1975

[21] Appl. No.: 596,624

[30] Foreign Application Priority Data

July 24, 1974 Italy .............................. 25518/74

[52] U.S. Cl. .................................. 328/130; 328/75; 328/153; 307/238; 307/246; 307/282; 307/88 MP; 340/172.5
[51] Int. Cl.² ................ H03K 17/02; H03K 13/247
[58] Field of Search ............ 328/129, 130, 75, 153; 307/238, 246, 282, 88 MP; 340/172.5

[56] References Cited

UNITED STATES PATENTS

| | | | |
|---|---|---|---|
| 3,662,186 | 5/1972 | Karklys | 328/129 |
| 3,876,950 | 4/1975 | O'Connor | 328/130 |
| 3,881,156 | 4/1975 | Deutsch | 328/129 |

*Primary Examiner*—John S. Heyman
*Attorney, Agent, or Firm*—Fleit & Jacobson

[57] ABSTRACT

A stored electronic device for producing pulses having predetermined rate and sequence on a number of output channels with a single input for supply and start. A selector is provided for preselecting the number of pulses which at each operation of the device are made sequentially available in the respective output channel or channels; two logical gates are energized by the operation of the device, performing the function of setting to zero all of the bistable logics and blocking a decoder. A fast oscillator acts upon a first counter capable of supplying scanning sequences to the decoder, and one or more buffer power stages with a memory or storage which is independent of any interruption of the power supply, the inputs of which are connected to the decoder and the outputs of which form the device output channels; the memory in the buffer stages being capable of blocking the fast oscillator and releasing a slow oscillator. A second counter supplies respective signals to logical gates for selection of the pulse sequences, energizing that logical gate which has been preselected by the selector; an inverter or changeover switch receives a signal from the energized logical gate producing a pulse which will block the slow oscillator determining the pulse sequence; and a resetting circuit is energized to bring the memory to its initial state.

9 Claims, 4 Drawing Figures

STORED ELECTRONIC DEVICE FOR PRODUCING PULSES HAVING PREDETERMINED RATE AND SEQUENCE

This invention relates to stored devices for producing electrical output pulses having a predetermined rate and sequence.

The prior art devices of this type are of electromechanical design and accordingly suffer from considerable restrictions, as to both the type and number of functions performable thereby, and performance quality. More particularly, such electromechanical devices are by nature thereof subjected to wear on the movable members, sensitive to vibrations, cumbersome and noisy, do not afford a constancy in rate by which the pulses are provided at the output, can have only a limited amount of output channels, the highest attainable frequency is restricted and give rise to problems in adjusting the electrical output power thereof.

The device according to the invention overcomes all of the above mentioned disadvantages and in addition to the typical functions of such electromechanical devices also allows it to perform further functions having a considerable utility in many applications.

According to the present invention, a stored electronic device is provided for producing pulses having predetermined rate and sequence on a number of output channels with a single input for supply and start and includes a selector for preselecting the number of pulses which at each operation of the device are made sequentially available in the respective output channel or channels; two logical gates being energized by the operation of the device, performing the function of setting to zero all of the bistable logics and blocking a decoder; a fast oscillator acting upon a first counter capable of supplying scanning sequences to the decoders; one or more buffer power stages with a memory or storage which is independent of any interruption of the power supply, the inputs of which are connected to the decoder and the outputs of which form the device output channels; the memory or storage in the buffer stages being capable of blocking the fast oscillator and releasing a slow oscillator; a second counter supplying respective signals to logical gates for selection of the pulse sequences, energizing that gate which has been preselected by a selector; an inverter or changeover switch for receiving a signal from the energized logical gate producing a pulse which will block a slow oscillator determining the pulse sequence; and a resetting circuit being operated when the last output channel is energized to bring the memory or storage back to its initial state, the memory or storage being suitably connected to the slow oscillator and second counter.

All of the components being used in the device according to the invention may be of the solid state type and, therefore, the device is of an extremely reduced overall size, also allowing for arranging the various parts in a separate and spaced apart relationship, depending on requirements of the available space or room.

Since the storage or memory is independent of any interruption in the power supply a single line can be conveniently used for simultaneously providing supply and start. Therefore, there is but one input for the device power supply. This is particularly advantageous because, when inoperative, the device is not live or hot. When after being removed, the power supply is applied again, the device resumes the interrupted sequence, exactly from the previously attained position.

A further advantage of the invention resides in that the pulse and sequence can be manually or automatically varied, thus enabling it to obtain such high rates as hitherto not obtainable by the prior art devices.

The output waveform of the device according to the invention is a rectangular waveform, wherein the ratio of active and passive portions can be manually or automatically varied. The device according to the invention can be manually or automatically reset.

These and further advantages will become more apparent in the following detailed description of an embodiment of the invention, wherein it is assumed by way of example a selection from among four possibilities of the amount or number of output pulses and to have 18 pulse output channels, as shown in the accompanying drawings, in which like reference numerals designate like elements, and wherein.

Figure 2:
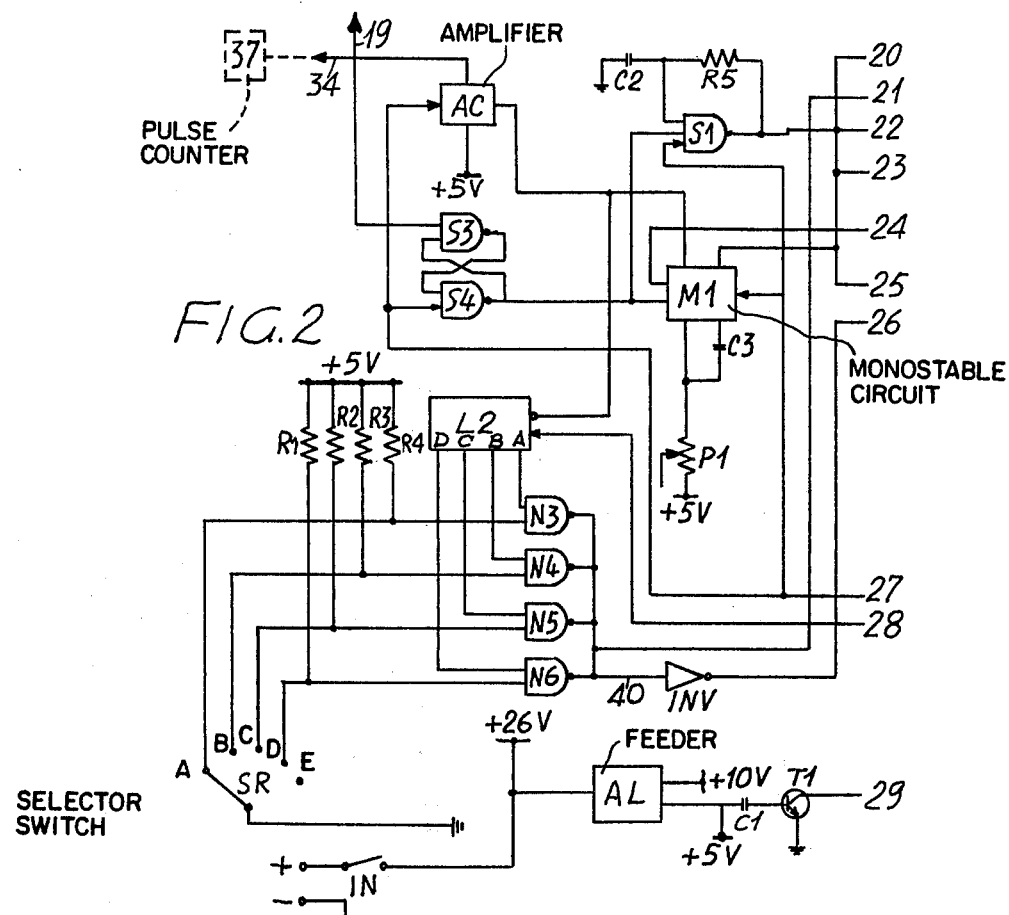
FIG. 2 is a schematic showing of the other part of the device.

As shown in FIG. 2 the power supply for the entire device is exclusively provided through the positive and negative input poles, respectively schematically designated by + and − in said FIG. 2. No other type of power supply is required. The device start control is provided through a switch IN, the operation of which also, supplies the required power.

A selector SR is connected to four logical NAND gates N3, N4, N5 and N6 and to four resistors R4, R5, R2 and R1, respectively, receiving a voltage of +5 volts. This voltage of +5 volts and a second voltage of +10 volts are generated by a stabilized power supply or feeder AL and are applied to the various components, this being designated on the drawings by references +5 V and +10 V, respectively, whereas reference +26 V indicates the voltage which is directly applied by the operation of said switch IN.

Figure 1:
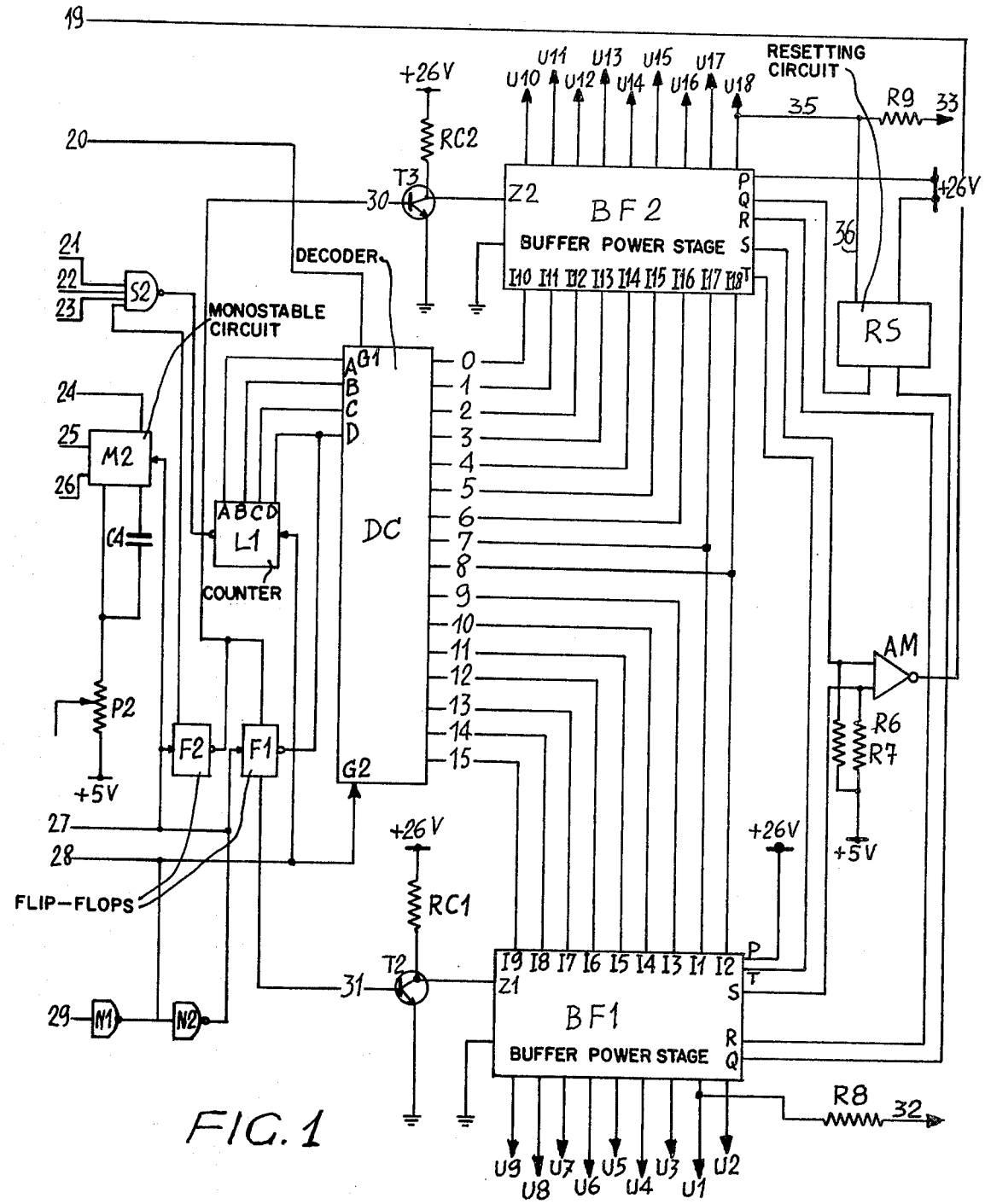
FIG. 1 is a schematic showing of a portion of the device according to the invention.

A capacitor C1, which is charged by said power supply or feeder AL, is connected to the base of a transistor T1, which in turn is connected by its collector through 29 to a NAND gate N1 as shown in FIG. 1 a second NAND gate N2 being connected to said NAND gate N1, and both being connected through 28 and 27 to the resetting inputs, indicated by an arrow, of logics DC, F1, F2, M2, M1, L2, S1, S2, S3 and S4.

In phase opposition between input and output, a logic gate S1 shown in FIG. 2 is connected to a capacitor C2 and a resistor R5, thus constituting an oscillator, the oscillations of which have a frequency dependent on the rates or values of C2 and R5.

At 22, said gate S1 is connected to a logic gate S2 shown in FIG. 1 suitable to apply pulses to a counter L1, the latter being connected through connections A, B, C and D to decoder DC. Through connection 0 to 15, said decoder DC is connected to two buffer power stages BF1 and BF2. Buffers BF1 and BF2 have the respective inputs Z1 and Z2 thereof connected to the collector of respective transistors T2 and T3, which are connected through load resistors RC1 and RC2, respectively, to said voltage of +26 V. The emitters of these transistors T2 and T3 are both connected to ground, whereas the base of transistor T2 is connected through 31 to flip-flop F1 and base of transistor T3 is connected through 30 to both flip-flops F1 and F2.

Outputs S and T of buffers BF1 and BF2 are series connected to an amplifier AM, the output 19 of which is connected to a flip-flop comprising two logical gates S3 and S4 as shown in FIG. 2. References R6 and R7 shown in FIG. 1 indicate balancing resistors for said amplifier AM.

Two monostable circuits M1 and M2 shown in FIGS. 1,2 forming a slow oscillator, are each connected to a respective RC circuit, comprising a capacitor C3 and a variable resistor P1 (for monostable circuit M1) and a capacitor C4 and a variable resistor P2 (for monostable circuit M2).

An inverter or changeover switch INV shown in FIG. 2 is for receiving pulses through 40 from that gate of said gates N3, N4, N5 and N6 which upon operation of the device is energized, and for applying through 26 a blocking signal for said monostable circuit M2.

An amplifier AC receives the pulses being generated by said monostable circuit M1 and provides for amplifying and applying the same through 34 to a possible pulse counter 37.

The two buffers BF1 and BF2 have eighteen output channels departing or branching therefrom (in the following these output channels being sometimes referred to as outputs for the sake of simplicity, that is nine output channels U1–U9 for buffer BF1, and nine output channels U10–U18 for buffer BF2. The buffer inputs are respectively designated by T1–I9 for buffer BF1, and I10–I18 for buffer BF2. The pulses at the first and last outputs (U1 and U18) are applied through limiting resistors R8 and R9 to outputs 32 and 33, respectively.

Figure 3:
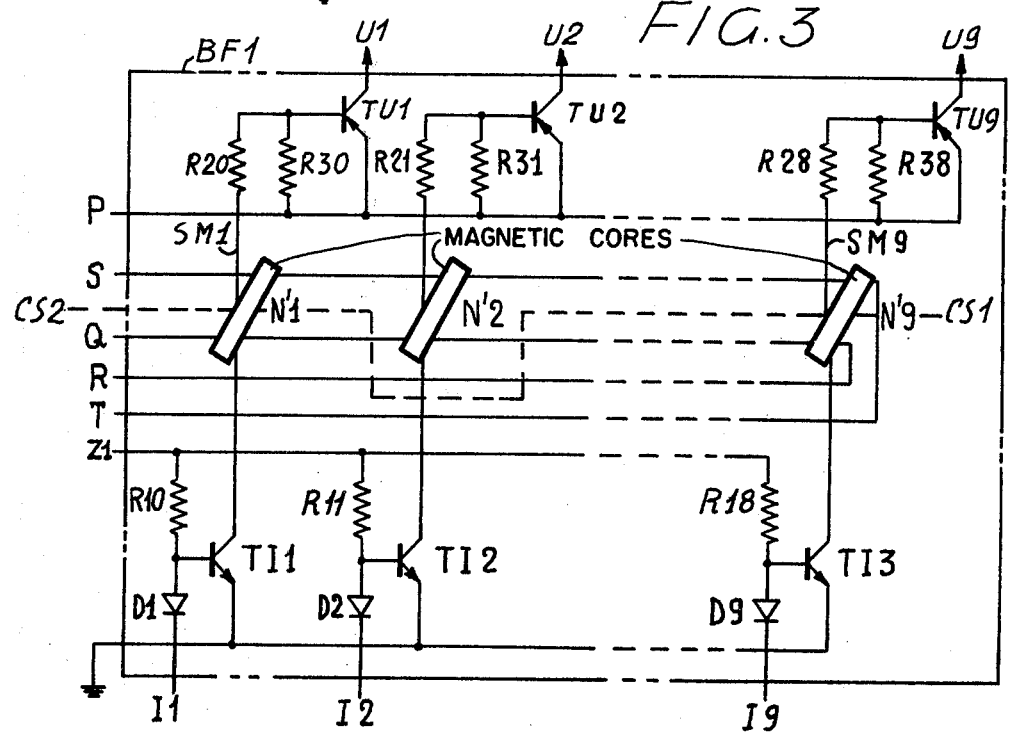
FIG. 3 is a detailed schematic showing of one of the buffer stages of FIG. 2.
Figure 4:
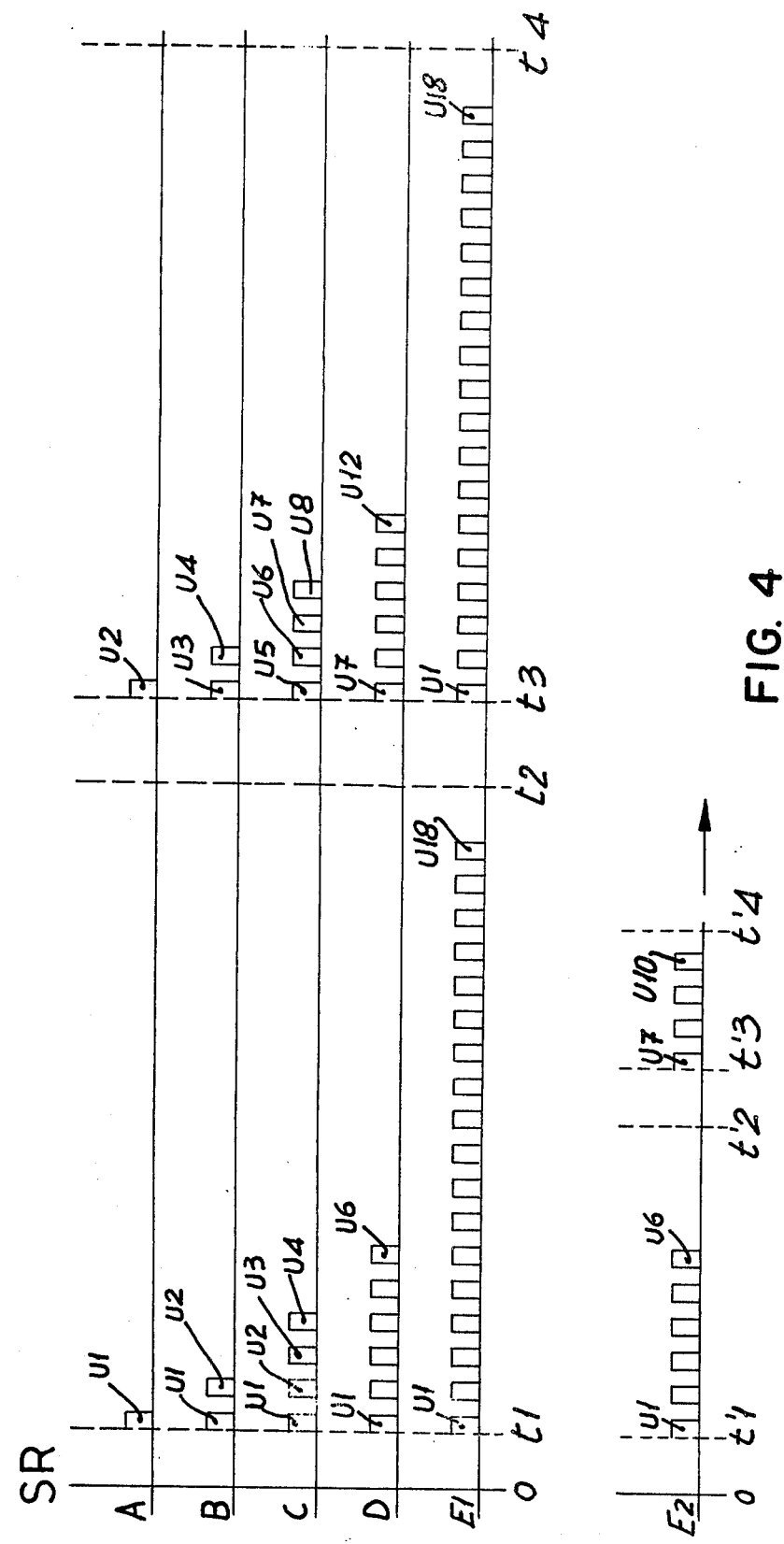
FIG. 4 is an illustration of a series of waveforms for the various portions of the selector switch incorporated in the invention.

Reference is now made to FIG. 3 for a more detailed description of the buffers and memory circuits. For the sake of simplicity, buffer BF1 is shown in detail in FIG. 3, it being understood that buffer BF2 is quite similarly arranged.

The buffer stage is BF1 supplied by said voltage of +26 V through connection P (see FIG. 2). The pulses from the decoder DC are applied to the buffer inputs, such as I1, and through a diode D1 drive on amplifier transistor TI1 which is biased by a resistor R10. The transistor TI1 is capable of closing a power transistor TU1 which is biased by resistors R20 and R30. The collector of transistor TU1 is connected to the output channel U1.

A connection (loop or turn) interwound with cores Q-R (see also FIG. 2) is for magnetizing in one direction a toroidal magnetic core N1, while a connection (loop or turn) S-T is arranged to receiving by electromagnetic induction a voltage pulse. Loop Q-R is connected to a resetting circuit RS, while loop S-T is connected to the amplifier AM.

An interwound conductor (loop) SM1 is also suitable for magnetizing N'1 in the opposite direction; when the collector current of transistor TI1 flows therethrough.

The components and associated connections as above described with reference to input I1 and output U1 are quite similar for all of the other inputs and outputs up to I9 and U9, respectively, and therefore any further detailed description thereof will be omitted.

The resetting circuit RS, more fully described in the following, is supplied with power at +26 V and through wires or conductors 35 and 36 receives the output voltage of U18.

CS1-CS2 is a possible additional loop for magnetizing in a suitable direction only part of the cores, that is, as shown in FIG. 3 all of the cores but core N2.

The operation of the device will now be described. By way of example it will be assumed that the five positions of selector SR, shown in FIG. 2, are respectively as follows: a first position for the emission of a single pulse for each operation in the respective sequential output channel (this first position of selector SR being the position a shown in the drawing); a second position B to provide two pulses for each operation in the respective sequential output channels; a third position c to six pulses, a fourth position D to eight pulses and the fifth and last position E to 18 pulses. This means that starting from the original state, for example with the selector at the position corresponding to four pulses, in the first operation initiated upon the closing of switch IN, one pulse is emitted from channel U1, followed by one pulse from channel U2, one pulse from channel U3 and finally one pulse from channel U4. the device is then stopped, even if switch IN is kept closed. On opening and closing switch IN again, one pulse is emitted from channel U5, one pulse from channel U6, one pulse from channel U7 and finally one pulse from channel U8, following which the device is stopped. The operation continues as above described at four pulses in a time period or sequence.

In order to better describe the operation in detail, hereinafter the operation order of the components follows illustrating the respective function thereof for a general initial condition as defined in the following representing one of the various possible conditions, and for example with a single pulse selection, that is, with said selector SR preset at the first position a, as shown in FIG. 2 with such a presetting of selector SR, upon the first operation of switch IN, the first output U1 will be energized, that is, the pulse is made available on and only in channel U1. By a second and subsequent operation of switch IN, channel U2 and only this channel will be energized, and sequentially so on to the last output U18, whereupon the device is automatically reset.

As a general initial condition referred to above, the outputs from the first output U1 to the thirteenth U13 will be assumed to be already energized. The fourteenth and next output U14 is energized as follows. Upon applying voltage, that is upon applying the power supply by closing switch IN, the feeder AL will generate stabilized voltages of +10 V and +5 V which, as above described, are supplied to the various components. It is to be noted that the connections between the various parts of the drawings are designated by same reference numerals. The step-up potential difference generated on capacitor C1 by the application of voltage +5 V closes transistor T1 which, through the two NAND gates N1 and N2, supplies two complementary signals, namely, one "high" signal and the other "low" signal, accurately positioning all of the bistable logical devices of the device at the starting position, and at the same time blocking the decoder DC by acting upon its input G2.

As the starting pulse ceases, the "fast" oscillator is released, this "fast" oscillator S1 having, for example, a frequency of 4 KHz. The time constant of this fast oscillator is established by capacitor C2 and resistor R5, such elements being positioned between the input and output of oscillator S1 in at phase opposition, generating an oscillation having a frequency depending on the values thereof. Through connection 22, the oscillator S1 drives a logical gate S2, which has its other inputs connected through 21 to N3, N4, N5 and N6, through 23 and 25 to M1 and M2, and through 41 to F2. Gate S2 supplies rectangular pulses to counter L1, the latter applying, through connections A, B, C and D, scanning sequences to decoder DC.

Through connections 0-15, the scanning sequence is applied to the two buffer power stages BF1 and BF2, respectively. Buffer BF1 is activated, that is, it receives the signals, since flip-flop F1 driven by N2 is at the condition of supplying a proper signal to the base 31 of transistor T2 having a load resistor RC1 connected thereto, closing this transistor T2, and thus setting to zero potential the input Z1 of buffer BF1. Buffer BF2 is cutoff and accordingly isolated, since the base 30 of transistor T3 having a load resistor RC2 connected thereto, receives a signal which is opposite to the signal arriving at the base of transistor 72, bringing the input Z2 of buffer BF2 to the voltage of +26 V.

The sequence will procede to the ninth channel (output U9), still at a rate of 4 KHz. Now, counter L1 has completed its capacity (or has become "full"), and upon resetting will supply from its output D a pulse to flip-flop F1, whereby the latter is switched.

Switching of flip-flop F1 causes an inversion in the respective conditions of transistors T2 and T3. As a result, buffer BF1 is disactivated and buffer BF2 is activated, and the sequence can proceed for outputs U10–U18 as above described in connection with buffer BF1.

Upon activation of the fourteenth channel, a memory in the buffer (the operation of which will be more particularly described in the following) provides a pulse which is supplied from Loop S and T to amplifier AM, this amplifier amplifying the pulse. Output 19 of amplifier AM switches the flip-flop comprising the two gates S3 and S4, blocking the fast oscillator S1 and releasing the slow oscillator comprising the two monostable circuits M1 and M2. As hereinafter described in detail, the rate of the slow oscillator is predetermined, as, for example, at a frequency of 30 cycles/sec.

Through gate S2, the oscillations being generated by the slow oscillator are supplied to counter L1 which proceeds to count by the new rate. At the same time, the pulses are supplied from monostable circuits M1 and M2 to counter L2, the latter sequentially applying a signal to the four NAND gates N3, N4, N5 and N6, activating that gate of these gates that has been preselected by selector SR. This is done bringing to earth potential through the connection operated by selector SR the input to the four NAND gates by means of four resistors R4, R3, R2 and R1, supplied from the +5 V power supply, and connected to said inputs, respectively. As pointed out above, the selector SR is shown in FIG. 1 is located at the position corresponding to connection A of counter L2, and therefore in such a case gate N3 will be activated, the potential of the second input to this gate being zero.

Thus, gate N3 is activated and generates a pulse which by means of inverter INV supplies along line 26 a signal blocking the monostable circuit M2 and accordingly the slow oscillator formed by M1 and M2. Now, the condition or state of the entire device is stationary, and the device can restart only by removing and then applying again the power supply through operation of switch IN. Thus, it is apparent that only under this condition will a step-up potential difference will appear across capacitor C1. This is one of the characterizing features of the device according to the invention.

It will be evident that the operation of the device is quite similar for any other general output or channel activated, starting from the already activated preceding channel. More particularly, the fast sequence (for example a sequence of 4 KHz, as above described) will always start from the output O of decoder DC, and upon arriving at the involved channel, it will become a slow sequence, as above described, and then continue to complete two cycles of counter L1, sequentially activating through flip-flop F1 the two buffers BF1 and BF2. At the end of these two cycles, a pulse from flip-flop F1 will switch flip-flop F2 which closes gate S2, therefore interrupting the arrival of pulses from the slow oscillator to said counter L1. As above described, the state or condition of the entire device is now stationary, and can restart only by removing and then applying again the power supply.

Turning again to the preselection provided by selector SR, it is apparent that should the selector be set at the fifth position E of FIG. 2, all of the gates N3, N4, N5 and N6 will be disactivated, since at such a position none of said gates will have its associated input connected to earth potential. Therefore, as clearly shown by the above detailed description, by the use of switch IN, output pulses will be sequentially produced on all of the output channels (18 channels, as a whole, in the embodiment shown in the drawings).

A description will now be given for the elements and operation of the invention which allow a variation in the ratio of the active and passive portions of the rectangularly shaped voltage at the output of each buffer channel in sequence. Such voltage has an active duration followed by a passive duration of zero voltage. The sum of the two durations makes up the total period which determines the selection rate of the output channels and rectangular wave therein.

As above described, this rectangular wave is generated by the slow oscillator comprising the two monostable circuits M1 and M2. The oscillator is driven by two variable time constant circuits respectively comprising a variable resistor, such as a potentiometer P1, to vary the active period with a capacitor C3, and a variable resistor, such as a potentiometer P2, to vary the passive period with a capacitor C4. The signal from monostable circuit M2 and corresponding to the passive period is used for inhibiting decoder DC in the second portion of the driving pulse through connection 20-G1; whereas the signal corresponding to the active period determines the electric output power for each cycle.

When it is desired to vary the active (or respectively passive) period, but without altering the total period, potentiometer P1 (or potentiometer P2) is actuated the passive (or active) period is varied by actuation of potentiometer P2 (or P1) so as to increase or decrease by a same amount the passive (or active) period, thus obviously obtaining an invariability in the total period.

It is also apparent that, when it is desired on the other hand, to vary the total period, but without altering the active-passive ratio, it will be only required to actuate both of the potentiometers P1 and P2, so as to provide the same variation in the same direction for the two active and passive periods.

Reference is now made to FIG. 3 for a more detailed description of the output power (buffer) stages and memory or storage circuits.

As above described, in the embodiments shown the buffers are two in number (BF1 and BF2) and the outputs 18 in number. Buffer BF1 supplies outputs U1 to U9, and buffer BF2 supplies outputs U10 to U18. Buffer BF1 is shown in FIG. 3 and buffer BF2 is similarly arranged.

For example, with respect to the first channel, the pulse from decoder DC enters the input I1 and through a diode D1 drives an amplifier transistor TI1 (biased by a resistor R10), the latter closing a power transistor TU1 which is biased by resistors R20 and R30. Because it is closed, transistor TU1 will activate the output channel U1, making the output voltage available thereon.

Upon flowing through the wire or conductor SM1, the collector current of transistor TI1 will magnetize a toroidal core N1 in a direction opposite to that at which it was formerly magnetized. A voltage pulse is generated by electromagnetic induction in loop S-T common to all of the cores and connected to amplifer AM (FIG. 2). This amplifier AM is suitably balanced by two resistors R6 and R7. As above described, the low scanning will now begin.

The operation for the other channels is the same. Since the elements in buffer BF1 are quite similar, a detailed description of the operation for the remaining channels is deemed as unnecessary.

When the last channel (namely the 18th channel in the described embodiment) is activated, the output voltage at U18 is applied through wires or conductors 35 and 36 to a resetting circuit RS (supplied by +26 V) forming part of the storage or memory. This resetting circuit RS comprises a stabilizer, an amplifier and a delay circuit, all of which may be conventional. The activated circuit RS produces an amplified, stabilized and suitably delayed current pulse, and supplies such a pulse to the cores (all of which are now magnetized in the above described direction) along connection (loop) Q-R, therefore magnetizing the cores in the original direction (which in the following will be referred to as first magnetizing direction). Thus, the memory or storage comprising buffers BF1 and BF2 is charged and accordingly ready to successively supply, the necessary pulses by magnetization in the second direction of the individual involved cores, when required.

If desired, with an additional circuit terminating at loops CS1 and CS2 (see FIG. 3) and prior to operation of the device, magnetization of some of the cores in the second direction may be carried out (in the embodiment of FIG. 3 all of the cores N'1-N'9 but except core N'2). During operation, the only pulse at the input to amplifier AM will be that of core N'2. Therefore, U2 will be the only output channel having a pulse thereon, all of the other channels remaining in an inactive condition. It will be apparent that the rate of the output signals and sequence in the increasing direction of numeration for the channels will remain unaltered.

As above described in connection with FIG. 2, the two buffers BF1 and BF2 are selectively activated, the activation occurring through the two transistors T2 and T3 when flip-flop F1 supplies thereto the required signal for closing the same. When this occurs, the supply current for the activated buffer only is grounded through the associated transistor.

As it will be apparent to those skilled in the art, toroidal magnetic cores may comprise other elements capable of performing a memory or storage function such as magnetic holding relays independent of any interruption in the electric power supply. In this connection, the relay position is used to test the state of the output channels being tested. As to the remaining elements, the organization and operation of the device are substantially unaltered.

The device according to the invention is also provided with additional outputs. More particularly, the pulses from the first and last output channels (U1 and U18) are applied through limiting resistors R8 and R9, respectively, to outputs 32 and 33, respectively. Such additional outputs may be used, for example, to drive an external indicator for signalling the cycle "preset" and "depletion" condictions.

The pulses generated by the monostable circuit M1 and amplifier AC are supplied to an output 34 to drive a possible pulse counter 37.

What is claimed is:

1. A stored electronic device for producing pulses having a predetermined rate and sequence on a number of output channels comprising, in combination, a single input connected to an associated power supply for starting the device, a selector for preselecting a number of pulses that for each operation of the device are sequentially made available on the respective output channel or channels, a decoder having a plurality of channels, two logical gates activated upon operation of the device which act upon one of the inputs of said decoder for blocking said decoder, a first counter for supplying scanning sequences to said decoder, a fast oscillator acting upon said first counter, a slow oscillator, at least one buffer power stage having a memory independent of any interruption in said power supply, said memory having inputs which are connected to said decoder, and outputs which form the output channels of the device, said memory in said buffer stage being arranged to block said fast oscillator and release said slow oscillator for determining the pulse rate, a plurality of logical gates, a second counter for supplying respective signals to said logical gates each for selecting a number of pulses to activate a gate which is preselected by said selector, an inverter switch for receiving a signal from said activated logical gate to provide a pulse blocking said slow oscillator a resetting circuit arranged to be actuated when the last output channel is activated to bring said memory back to an initial state and means for connecting said memory to said slow oscillator and to said second counter.

2. A device as set forth in claim 1, wherein the component parts of the device are of the solid state type.

3. A device as claimed in claim 1, wherein said memory is of the magnetic type.

4. A device as claimed in claim 3 wherein said memory comprises a plurality of toroidal magnetic cores and a circuit for resetting a magnetization state interconnected with said cores, a circuit interconnected with each of said magnetic cores for reversing said magnetization state and activating the associated output channel, a flip-flop circuit and a third common induced circuit for blocking said fast oscillator and starting said slow oscillator through said flip-flop circuit.

5. A device as claimed in claim 3, wherein said memory comprises a magnetic holding relay, having a position for testing the state of the output channels being scanned.

6. A device as claimed in claim 1 wherein said slow oscillator is arranged to generate rectangular waves having active and passive periods and comprises a variable time constant circuit for varying the active-passive ratio of said waves and therefore said output pulses.

7. A device as claimed in claim 6, wherein said variable time constant circuit comprises a first R-C variable resistor circuit for varying said active period, and a second R-C variable resistor circuit for varying said passive period of said rectangular waves.

8. A device as claimed in claim 3, wherein the number of output channels of the device is independent of the number of decoder channels, said decoder being arranged to sequentially supply all of said output channels without activating the same and a series of flip-flops to provide an additional signal for activation of the output channels, said series of flip-flops being preset to enable the pulse output in due sequence.

9. A device as claimed in claim 8 wherein said toroidal magnetic cores are arranged to control the pulse output in the associated output channel by premagnetization thereof, an additional circuit for extending said premagnetization to at least some of said cores and not to the remaining cores to thereby provide for activation only of those channels associated with said additional circuit, while maintaining the same sequence in the increasing direction of numeration for said channels and at the same rate.

* * * * *